(12) United States Patent
Hsiao

(10) Patent No.: US 6,830,194 B2
(45) Date of Patent: Dec. 14, 2004

(54) BUILT-IN MULTIFUNCTIONAL CARD READER

(75) Inventor: Wen-Hsiang Hsiao, Taipei (TW)

(73) Assignee: WEM Technology Inc., Taipei (TW)

( * ) Notice: Subject to any disclaimer, the term of this patent is extended or adjusted under 35 U.S.C. 154(b) by 55 days.

(21) Appl. No.: 10/378,830

(22) Filed: Mar. 5, 2003

(65) Prior Publication Data

US 2004/0173676 A1 Sep. 9, 2004

(51) Int. Cl.[7] ............................................. G06K 19/06
(52) U.S. Cl. ..................................... 235/492; 235/487
(58) Field of Search ................................ 235/486, 492, 235/441, 487

(56) References Cited

U.S. PATENT DOCUMENTS 5,877,488 A * 3/1999 Klatt et al. ................. 235/486
6,069,795 A * 5/2000 Klatt et al. ................. 361/737
6,454,164 B1 * 9/2002 Wakabayashi et al. ...... 235/380

* cited by examiner

*Primary Examiner*—Karl D. Frech
(74) *Attorney, Agent, or Firm*—Bacon & Thomas, PLLC

(57) ABSTRACT

The built-in multifunctional card reader is comprised of a circuit board in a housing as a principal unit; the circuit board is provided with a control circuit formed by connecting among a loop of an externally connecting device, a loop for an integrated circuit and a memory card loop. Wherein the card reader makes separation of the operation voltage of various memory cards in the card reader from the loop of the externally connecting device to maintain the normal operation of the card reader as well as to get an effect of EMI prevention by providing a circuit connector on a circuit board in connecting with a power supplying device to directly make the circuit board supply power for operation of the card reader, and by providing a main signal connector on the circuit board to form connection among the integrated circuit, the memory card loop and the main board, further by providing an auxiliary signal connector in the loop of the externally connecting device to form connection between the externally connecting device and the main board.

3 Claims, 8 Drawing Sheets

BUILT-IN MULTIFUNCTIONAL CARD READER

BACKGROUND OF THE INVENTION

1. Field of the Invention

The present invention is related to a built-in multifunctional card reader, and especially to such a card reader capable of separating the operation voltage of a memory card of the card reader from the voltage source of a loop of an externally connected device, operation of the loop of the memory card being done directly by supplying an output voltage from the power supplying device, so that the card reader can operate normally.

2. Description of the Prior Art

As shown in FIG. 1, which is a structural sectional view of a conventional built-in multifunctional card reader, wherein the whole card reader A includes a circuit board A2 in a housing A1 as a principal. The circuit board A2 is provided with a circuit connector A21 in order that the circuit connector A21 can be connected with a main board (not shown) to connect the card reader A with the main board, and to supply power for operation of the card reader A through the main board.

The circuit board A2 is provided on the front surface of the housing A1 with an insertion slot A22 for insertion of a memory card, and at least an insertion slot A24 provided for connecting of an externally connecting device; and an integrated circuit A23 is connected between the insertion slot A22 and the circuit connector A21 to control operation of the entire card reader A, and further to form the connection between the memory card and the main board.

When the built-in multifunctional card reader is in use, data accessing of the memory card and riving of the externally connecting device may be done simultaneously, this causing division of the electric current supplied to the circuit board; with the result that the volume of electric current of the main board is smaller originally than that of the power supplying device, and when the main board simultaneously drives the externally connecting device and reads the memory card, it will be unable to supply sufficient current and thereby influence voltage, so that the output voltage will be unable to get to the state of having adequate voltage. This will affect the normal operation of the entire card reader.

SUMMARY OF THE INVENTION

The built-in multifunctional card reader of the present invention separates the operation voltage of various memory card loops in the card reader from the loop of the externally connected device to maintain the normal operation of the card reader as well as to get an effect of EMI prevention by providing a circuit connector on a circuit board for connecting with a power supplying device to directly make the circuit board supply power for operation of the card reader, by providing a main signal connector on the circuit board to form a connection among an integrated circuit, a memory card loop and a main board, and further by providing an auxiliary signal connector in the loop of the externally connecting device to form a connection between the externally connecting device and the main board.

The present invention will be apparent in its structural combination and the entire mode of operation thereof after reading the detailed description of the preferred embodiment thereof in reference to the accompanying drawings.

DETAILED DESCRIPTION OF THE PREFERRED EMBODIMENT

Figure 1:
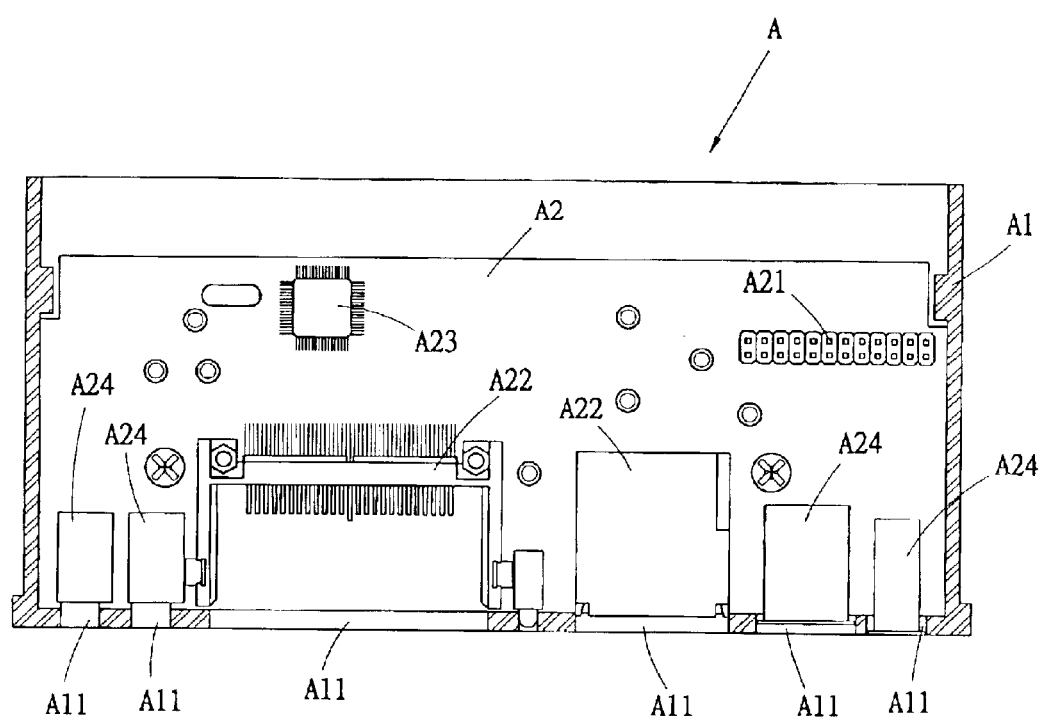
FIG. 1 is a sectional view showing the structure of a normal built-in multifunctional card reader.
Figure 2:
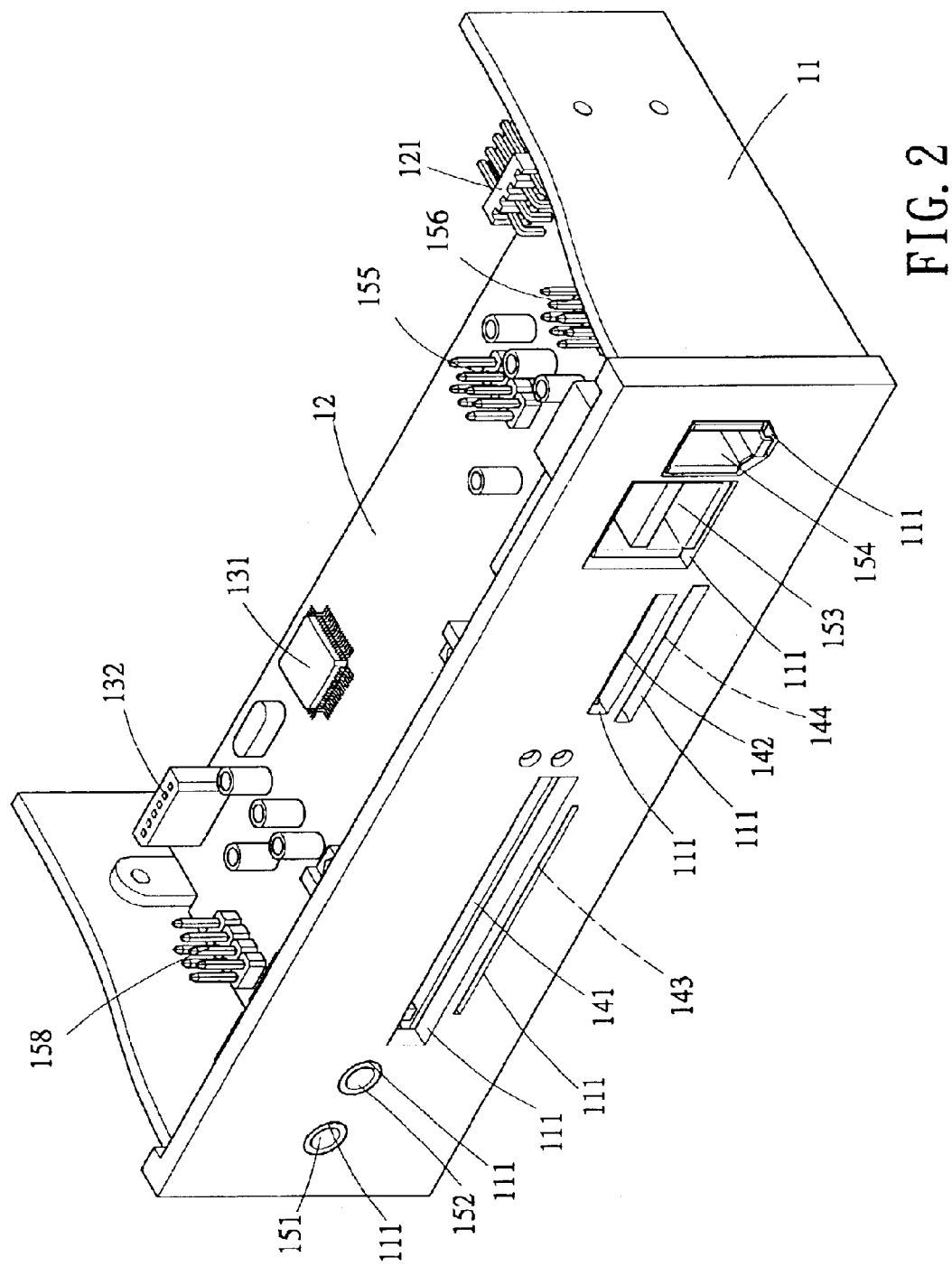
FIG. 2 is a perspective view showing the apparent structure of the card reader of the present invention.
Figure 3:
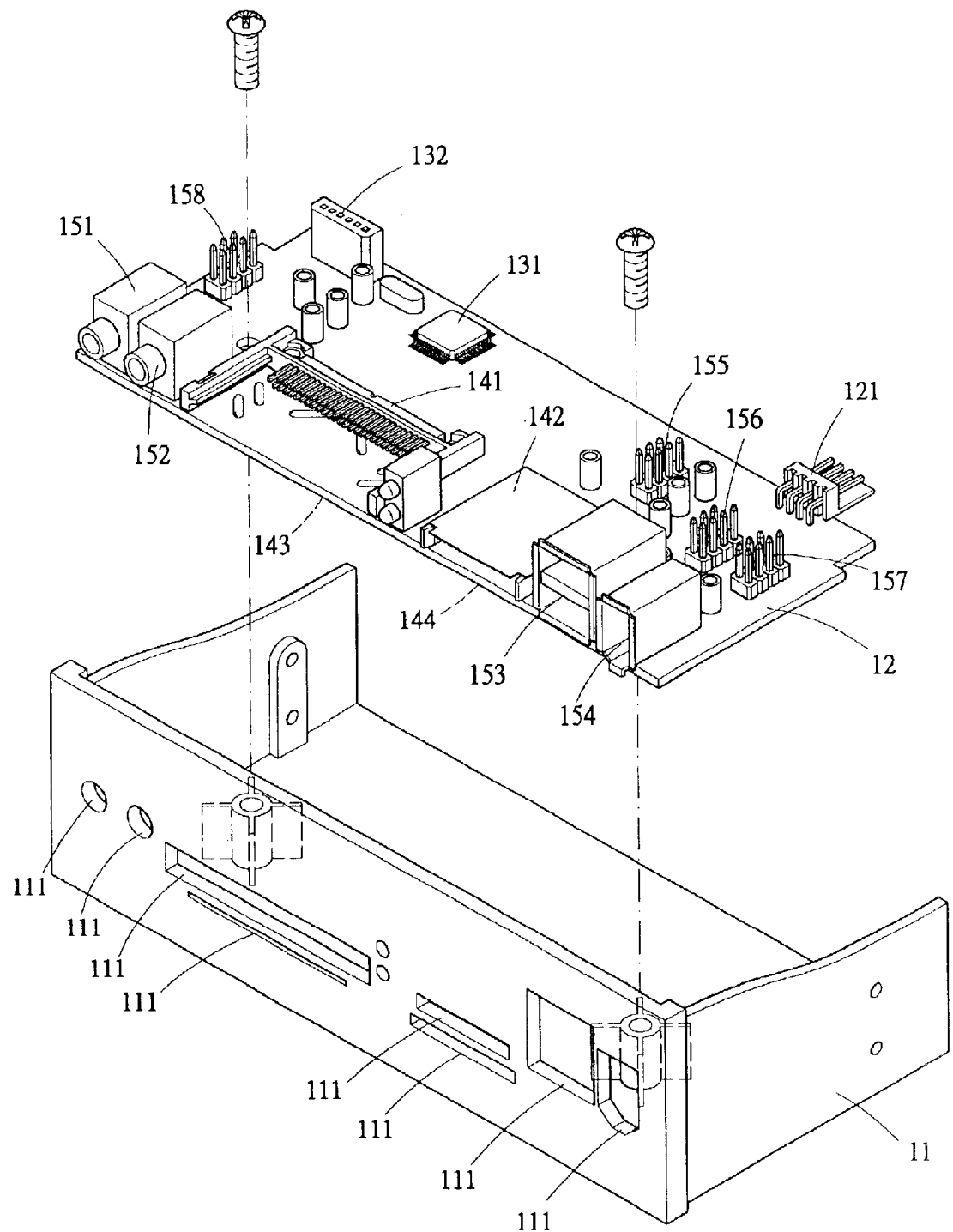
FIG. 3 is an analytic perspective view showing the structure of the card reader of the present invention.

The structure of the built-in multifunctional card reader of the present invention is comprised, as shown in FIGS. 2 and 3, of a circuit board 12 in a housing 11 as a principal unit; the circuit board 12 is provided with a control circuit formed by connecting among a loop 15 of an externally connecting device (referring to FIG. 5), a loop 13 for an integrated circuit 131 (referring to FIG. 6) and a memory card loop 14 (referring to FIG. 7); the housing 11 is provided on the front side thereof with a plurality of openings 111 for passing therethrough a connector of a memory card and an externally connecting device.

Figure 4:
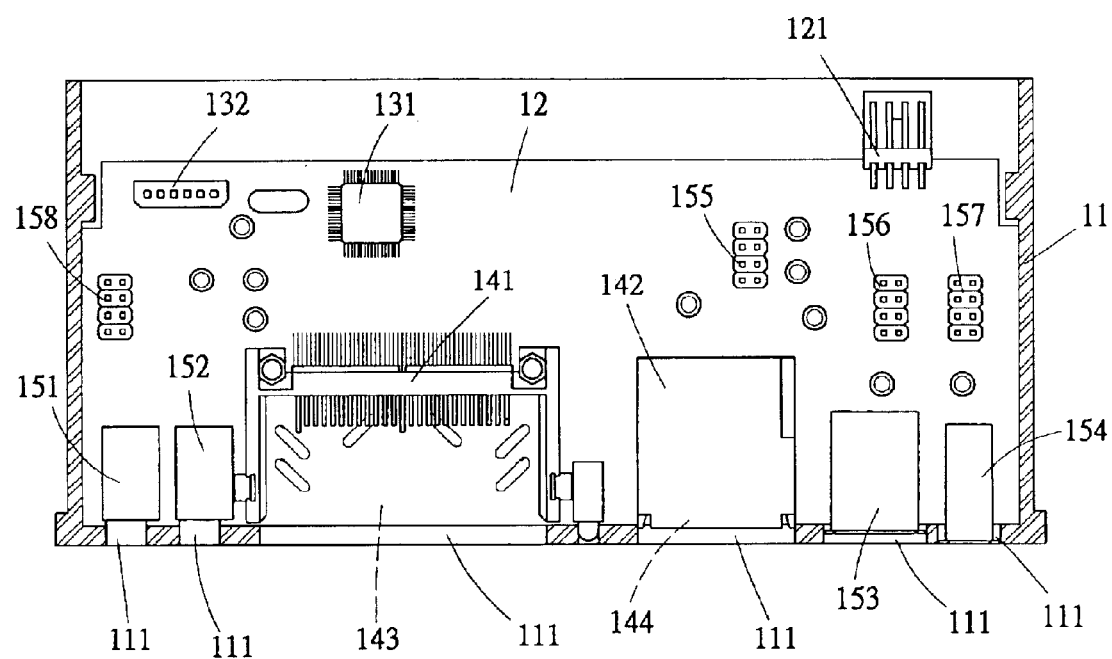
FIG. 4 is a sectional view showing the structure of the card reader of the present invention.
Figure 5:
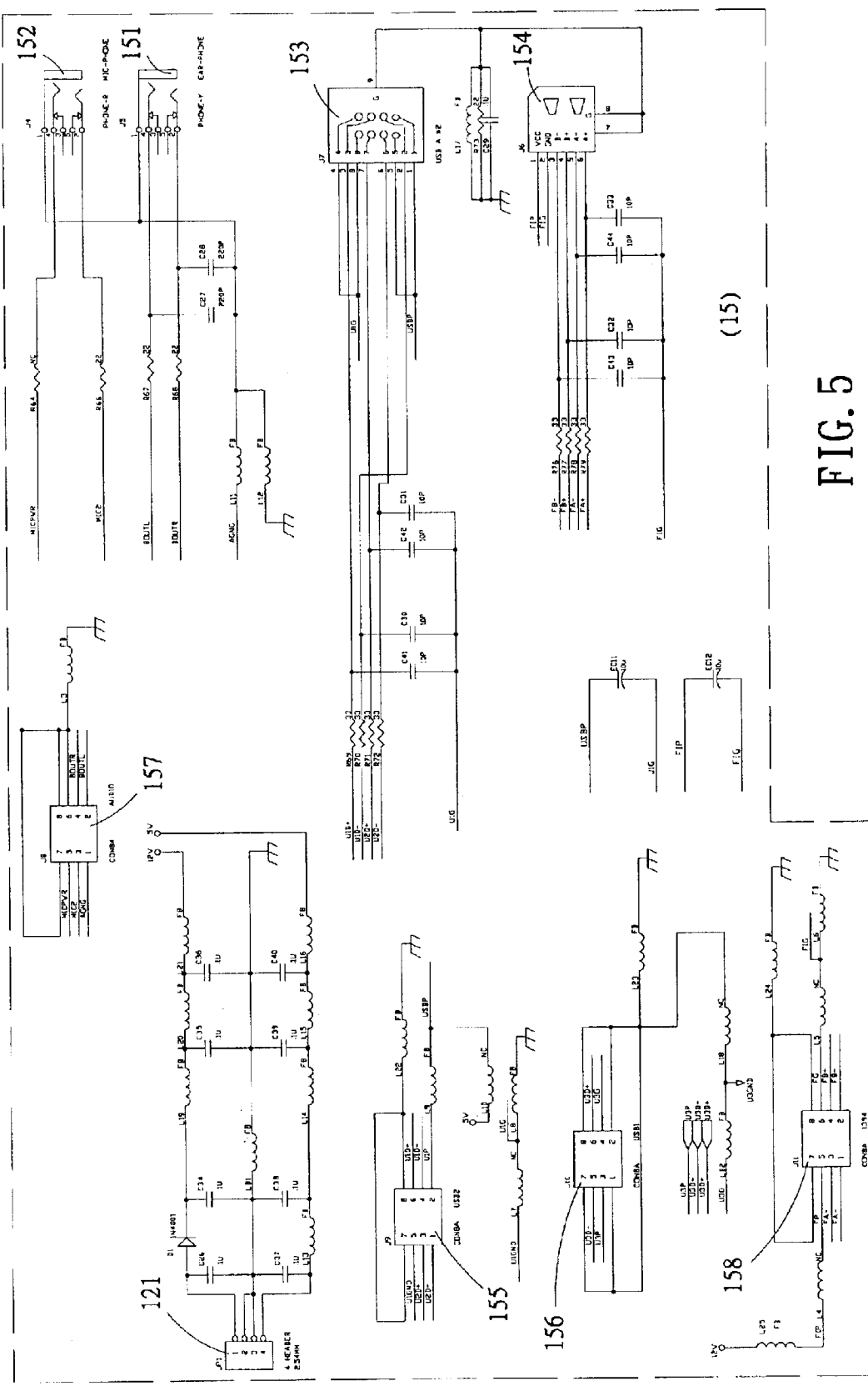
FIG. 5 is a circuit diagram showing allocation of the loop of an externally connecting device of a control circuit in the present invention.
Figure 6:
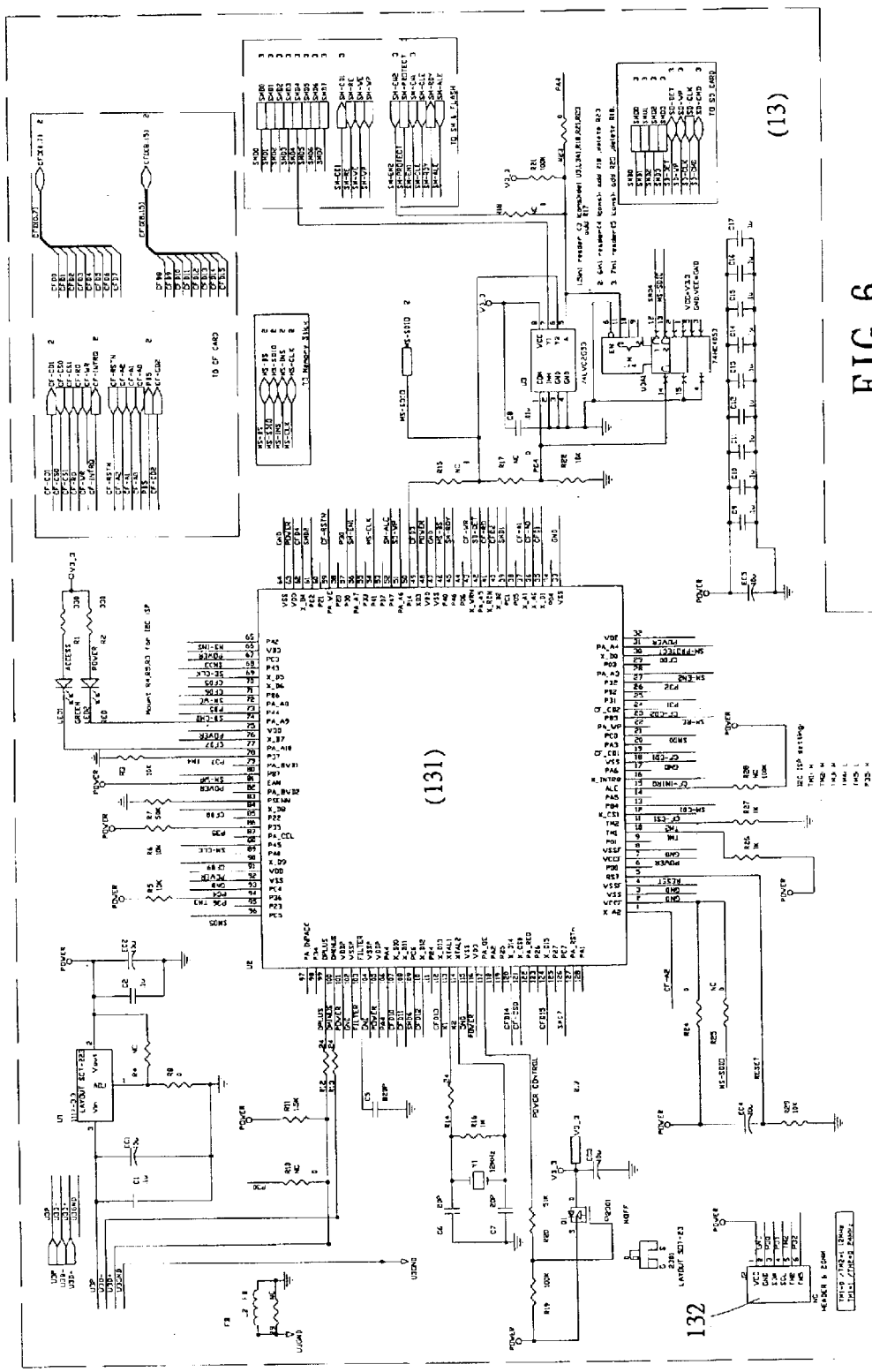
FIG. 6 is a circuit diagram showing allocation of the loop of an integrated circuit of the control circuit in the present invention.
Figure 7:
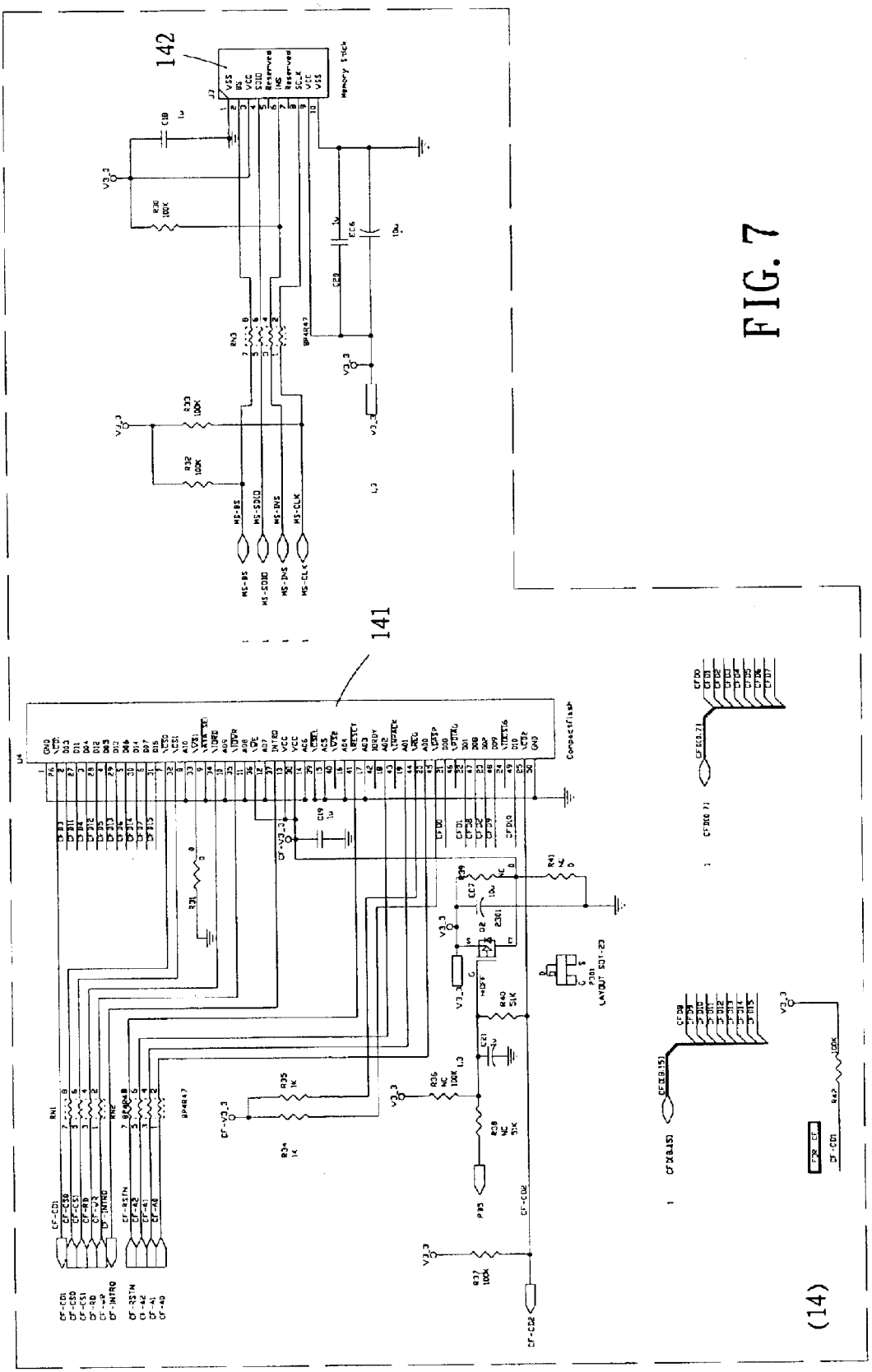
FIG. 7 is a circuit diagram showing allocation loops of an insertion slot for a CF/MD memory card in a memory card loop and of an insertion slot for an MS memory card.
Figure 8:
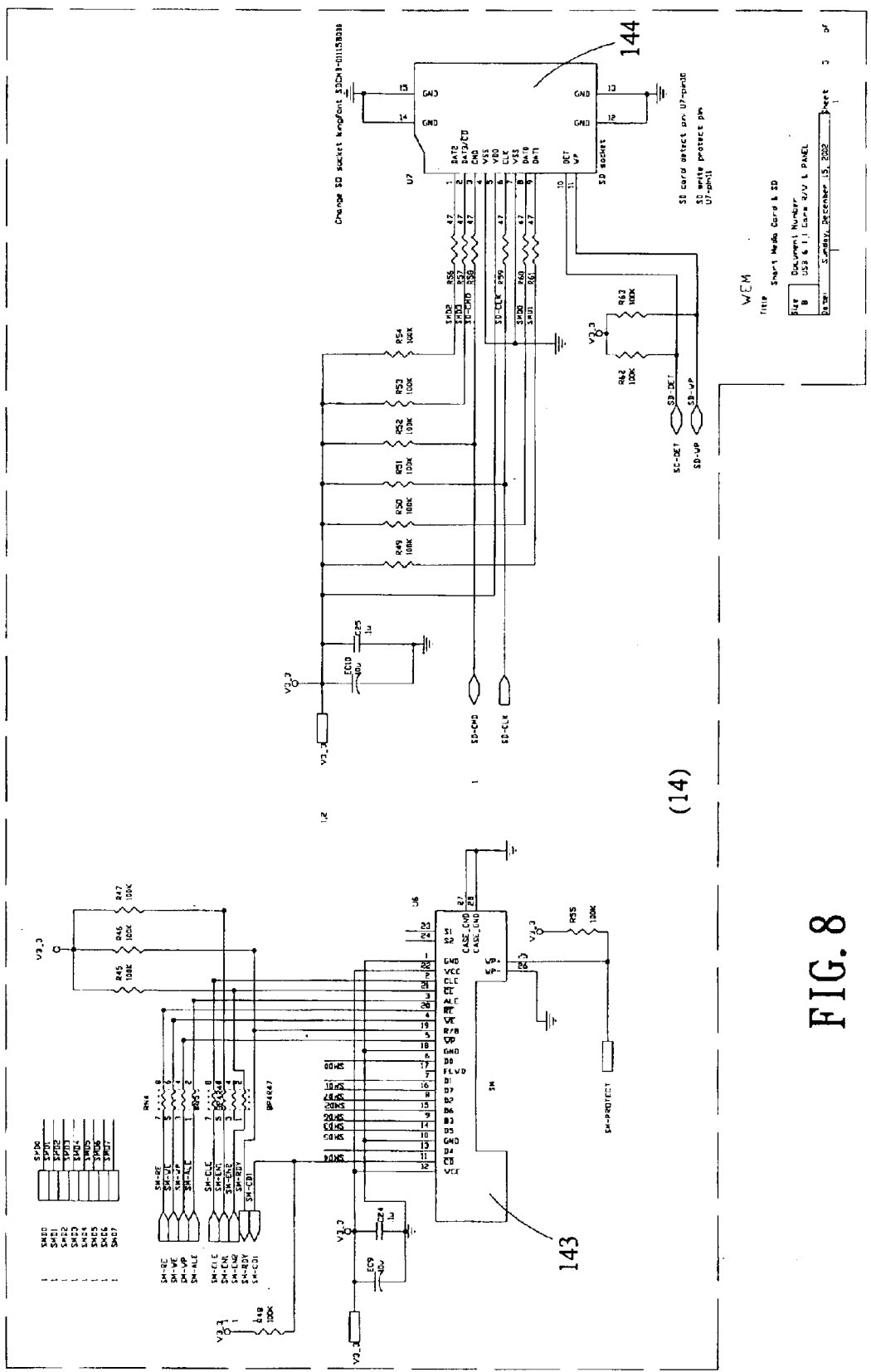
FIG. 8 is a circuit diagram showing allocation of the loop of an insertion slot for an SM memory card and the loop of an insertion slot for a SD memory card.

As shown in FIGS. 4, 5, the loop 15 of the externally connecting device is provided with an output insertion slot 151 for acoustic source signals, an input insertion slot 152 for acoustic source signals, a USB (Universal Serial Bus) insertion slot 153 and an IEEE 1394 insertion slot 154. As shown in FIGS. 4, 7, and 8, the memory card loop 14 is provided with an insertion slot 141 for a CF/MD (compact flash/microdrive) memory card, an insertion slot 142 for an MS (memory stick) memory card, an insertion slot 143 for an SM (smart media) memory card and an insertion slot 144 for an SD (secure digital) memory card. The loop 13 for the integrated circuit 131 is provided, as shown in FIGS. 4, 6 and 7, with the integrated circuit 131 to form connection of the memory card loop 14 with a main board, and to control the circuit operation of the entire circuit board 12.

And particularly as shown in FIGS. 4 and 5, the circuit board 12 is provided with a circuit connector 121 for connecting with a power supplying device (not shown); the power supplying device directly supplies power for operation of the card reader. As shown in FIGS. 4, 6, 7 and 8, a main signal connector 132 forms a connection among the loop 13 for the integrated circuit 131, the memory card loop 14 and the main board. And as shown in FIGS. 4 and 5, the loop 15 of the externally connecting device is provided with an auxiliary signal connector to form a connection between the externally connecting device and the main board. The auxiliary signal connector in the embodiment depicted in the drawings includes a first auxiliary signal connector 155 for connecting with the USB insertion slot 153, a second auxiliary signal connector 156, a third auxiliary signal connector 157 for connecting with the IEEE 1394 insertion slot 154 and a fourth auxiliary signal connector 158 for connecting with the output insertion slot 151 as well as the input insertion slot 152 for acoustic source signals.

Therefore, the operation voltage of the memory card loop 14 of the card reader can be separated from the voltage source of the loop 15 of the externally connecting device; operation of the loop of the memory card is done directly by supplying output voltage from the power supplying device, this can maintain normal operation of the card reader and can get an effect of EMI prevention.

As is stated above, the built-in multifunctional card reader of the present invention provides a better practicable structure for built-in multifunctional card readers. The description hereinabove and the attached drawings are only for illustrating a preferred embodiment of the present invention, and not for giving any limitation to the scope of the present invention. It will be apparent to those skilled in this art that various modifications or changes in structure without departing from the spirit, scope and characteristic of this invention shall also fall within the scope of the appended claims of the present invention.

What is claimed is:

1. A built-in multifunctional card reader comprising a circuit board in a housing as a principal unit, said circuit board including a control circuit formed by connecting a loop of an externally connecting device, a loop for an integrated circuit and a memory card loop for connecting memory cards with said circuit board; wherein:

said externally connecting device provides a connection to an external device, said circuit board includes:

a circuit connector for directly connecting said circuit board with a power supplying device to supply power for operation of said card reader;

a main signal connector to form a connection among said integrated circuit, said memory card loop and a main board; and an auxiliary signal connector provided in said loop of said externally connecting device to form a connection, separate from said connection formed by said main signal connector, between said externally connecting device and said main board, said card reader thereby separates the operation voltage of memory cards in said card reader from said loop of said externally connecting device to maintain normal operation of said card reader, and said loop of said externally connecting device is provided with an output insertion slot for acoustic source signals, an input insertion slot for acoustic source signals, a USB (universal serial bus) insertion slot and an IEEE 1394 insertion slot.

2. The built-in multifunctional card reader as in claim 1, wherein said memory card loop is provided with an insertion slot for a CF/MD (compact flash/microdrive) memory card, an insertion slot for an MS (memory stick) memory card, an insertion slot for an SM (smart media) memory card and an insertion slot for an SD (secure digital) memory card.

3. The built-in multifunctional card reader as in claim 1, wherein said housing is provided on the front side thereof with a plurality of openings for passing therethrough a connector of a memory card and said externally connecting device.

* * * * *